(12) United States Patent
Huang

(10) Patent No.: US 12,380,955 B2
(45) Date of Patent: Aug. 5, 2025

(54) MEMORY CONTROLLER AND METHOD FOR ADAPTIVELY PROGRAMMING FLASH MEMORY

(71) Applicant: Winbond Electronics Corp., Taichung (TW)

(72) Inventor: Chung-Meng Huang, Hsinchu (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 378 days.

(21) Appl. No.: 18/151,062

(22) Filed: Jan. 6, 2023

(65) Prior Publication Data

US 2024/0233840 A1 Jul. 11, 2024

(51) Int. Cl.
*G11C 11/34* (2006.01)
*G11C 16/10* (2006.01)
*G11C 16/30* (2006.01)
*G11C 16/34* (2006.01)

(52) U.S. Cl.
CPC ........ *G11C 16/3459* (2013.01); *G11C 16/102* (2013.01); *G11C 16/30* (2013.01)

(58) Field of Classification Search
CPC ............ G11C 16/3454; G11C 16/3459; G11C 11/5628; G11C 16/0483; G11C 2211/5621
USPC ........................................ 365/185.22, 189.11
See application file for complete search history.

(56) References Cited

U.S. PATENT DOCUMENTS

| 7,826,271 B2 | 11/2010 | Cernea |
| 8,270,215 B2 | 9/2012 | You et al. |
| 2019/0179532 A1* | 6/2019 | Tseng ................... G11C 7/1039 |

FOREIGN PATENT DOCUMENTS

| CN | 115064201 A | 9/2022 |
| TW | I307099 A | 3/2009 |

* cited by examiner

*Primary Examiner* — Son T Dinh
(74) *Attorney, Agent, or Firm* — Birch, Stewart, Kolasch & Birch, LLP

(57) ABSTRACT

A memory controller for controlling a flash memory is provided. The memory controller includes a control circuit and a voltage generator. The control circuit is configured to program one or more pages of the flash memory in sequence, wherein each page includes a plurality of bytes. The voltage generator is configured to adjust the output voltage according to the control signal from the control circuit. The control circuit performs a programming verification operation on each byte of a current page of the one or more pages in a page programming mode, and calculates the first number of bytes which fail the programming verification operation and performs a programming operation again. The control circuit determines the programming mode of the page after the current page as the page programming mode or the byte programming mode according to the first number.

12 Claims, 6 Drawing Sheets

MEMORY CONTROLLER AND METHOD FOR ADAPTIVELY PROGRAMMING FLASH MEMORY

BACKGROUND OF THE INVENTION

Field of the Invention

The present invention relates to flash memory, and, in particular, to memory controllers and methods for adaptively programming flash memory.

Description of the Related Art

The flash memory can be classified as NOR flash memory or NAND flash memory. Both NOR flash memory and NAND flash memory require a programming operation to write the data into the memory cell in the flash memory and require an erase operation to delete the data from the memory cell in the flash memory. However, when preforming a programming verification operation on the flash memory, traditional memory controllers usually use only one programming mode. For flash memory which has been cyclically used many times, because the threshold voltages of the memory cells of the flash memory may change, and the programming time of a portion of the memory cells may be longer, it usually takes a longer overall programming time for the traditional memory controllers to complete programming verification operations on all of the bytes in one page, which decreases the performance of the flash memory. Thus, a memory controller and a method for adaptively programming flash memory are needed to solve the above problem.

BRIEF SUMMARY OF THE INVENTION

An embodiment of the present invention provides a memory controller for controlling a flash memory. The memory controller comprises a control circuit and a voltage generator. The control circuit is configured to program one or more pages of the flash memory in sequence, wherein each page includes a plurality of bytes. The voltage generator is configured to adjust the output voltage according to a control signal from the control circuit. The control circuit performs a programming verification operation on each byte of the current page of the one or more pages in a page programming mode. The control circuit calculates the first number of bytes which fail the programming verification operation and have been performed a programming operation again The control circuit determines the programming mode of the page after the current page as the page programming mode or the byte programming mode according to the first number.

An embodiment of the present invention provides a method for adaptively programming a flash memory. The method is performed by a memory controller, wherein the memory controller comprises a control circuit and a voltage generator. The method comprises the following operations. The control circuit programs one or more pages in the flash memory in sequence. Each page includes a plurality of bytes. The control circuit performs a programming verification operation on each byte of the current page of the one or more pages in a page programming mode. The control circuit calculates the first number of bytes which fail the programming verification operation and have been performed a programming operation again. The control circuit determines the programming mode of the page after the current page as the page programming mode or the byte programming mode, according to the first number.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
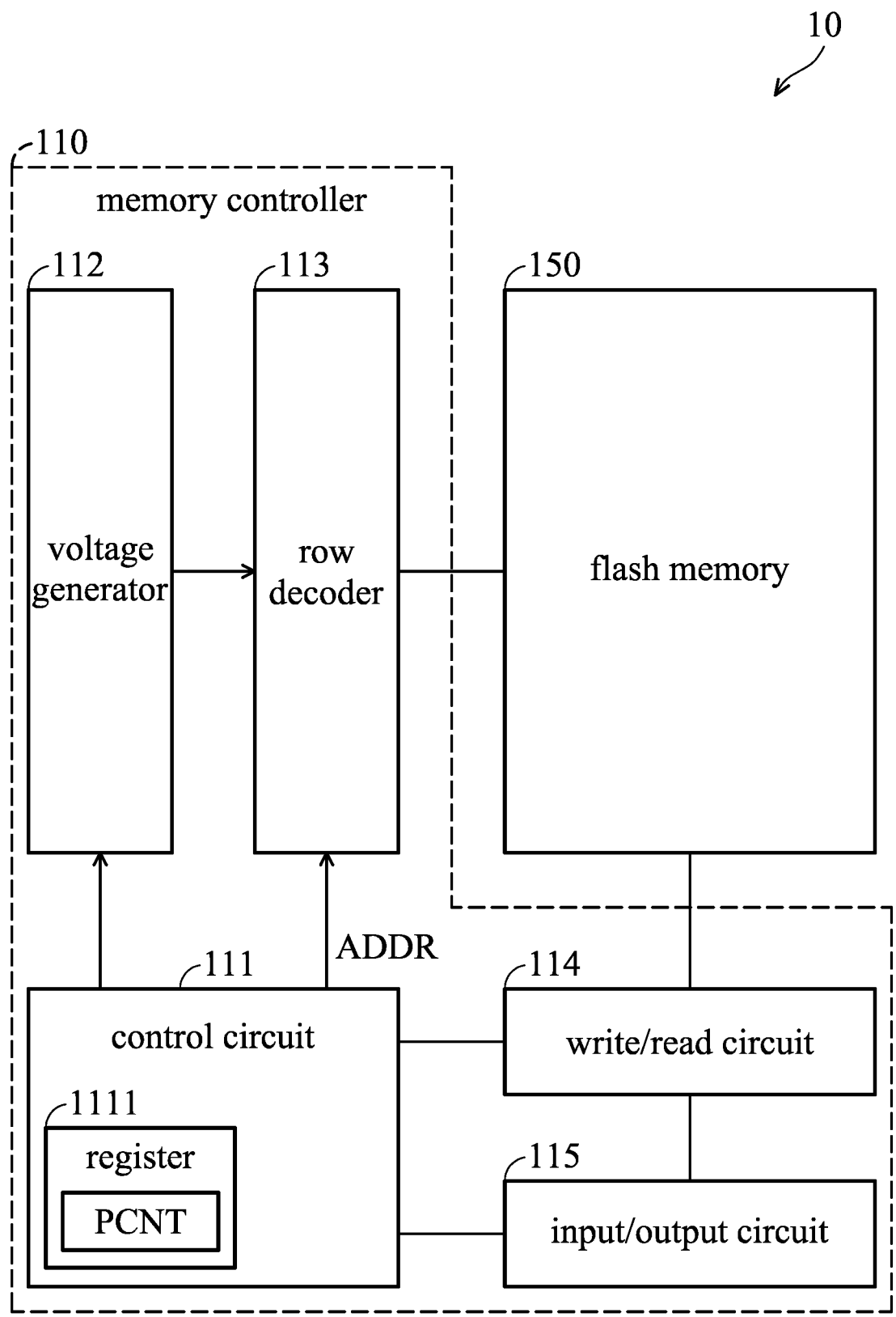
FIG. 1 shows a schematic view of a flash memory device, according to an embodiment of the disclosure.

FIG. 1 shows a schematic view of a flash memory device, according to an embodiment of the disclosure. As illustrated in FIG. 1, a flash memory device 10 comprises a memory controller 110 and a flash memory 150. The memory controller 110 is electrically coupled to the flash memory 150. For example, the flash memory 150 may be, but not limited to, a NOR flash memory. The flash memory 150 may, for example, comprises a plurality of memory cells, which are arranged in the way of two-dimensional array (i.e., M rows and N columns). Each row and column of the memory cells connects to a corresponding word line and a corresponding bit line respectively. In addition, each of the memory cells can store the data of 1 bit or M bits, wherein M is an integer greater than 1.

The memory controller 110 may, for example, be implemented by an integrated circuit. The memory controller 110 comprises a control circuit 111, a voltage generator 112, a row decoder 113, a write/read circuit 114, and an input/output circuit 115. Control circuit 111 is configured to control the overall operation of the flash memory device 10, such as comprising the read operation, the erase operation and the erase/verification operation, the programming operation and the programming/verification operation of the flash memory 150. In addition, the control circuit 111 comprises a register 1111, which is configured to store various counter values and temporary data required by the control circuit 111 when performing the different operations of the flash memory 150.

The voltage generator 112 is controlled by the control circuit 111 to produce the required voltage values used in the programming operation, the erase operation, and the read operation. In some embodiments, the voltage generator 112 may be implemented by such as a charge pump having multiple target voltages. The row decoder 113 is arranged to select and drive a particular row in the memory cell array, according to a page address signal ADDR from the control circuit 111.

The read/write circuit 114 may act as for example the sensing amplifier and the write driver respectively when the control circuit performing read operations and programming operations on the flash memory 150. For example, in the read operations, the read/write circuit 114 may act as a sensing amplifier to sense a data from the selected memory cell, such as temporarily storing the data to a page buffer (not shown in the FIG. 1) of the read/write circuit 114. Then, the input/output circuit 115 may receive the data from the read/write circuit 114 and transmit the received data to an external device. In the programming operations, the read/write circuit 114 may act as the write driver to drive the selected memory cell of the selected row, according to the programming data.

When the memory controller 110 performing the programming operation on the flash memory 150, the control circuit 111 can select page programming mode, or byte programming mode to perform the programming operation. The operation processes of using page programming mode and byte programming mode alone are illustrated in FIGS. 2 and 3 respectively.

Figure 2:
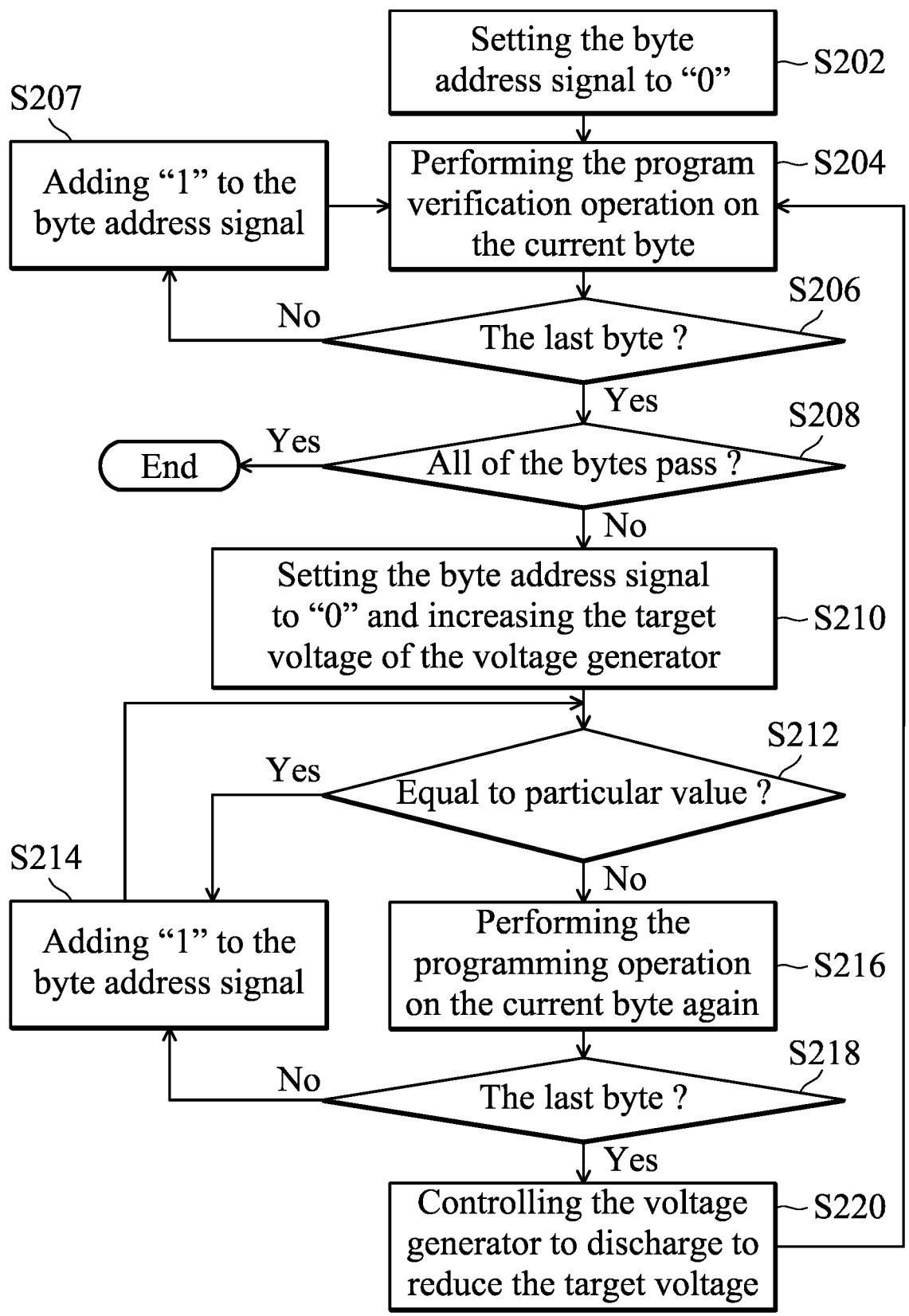
FIG. 2 shows a flow chart of a page programming mode, according to an embodiment of the disclosure.
Figure 3:
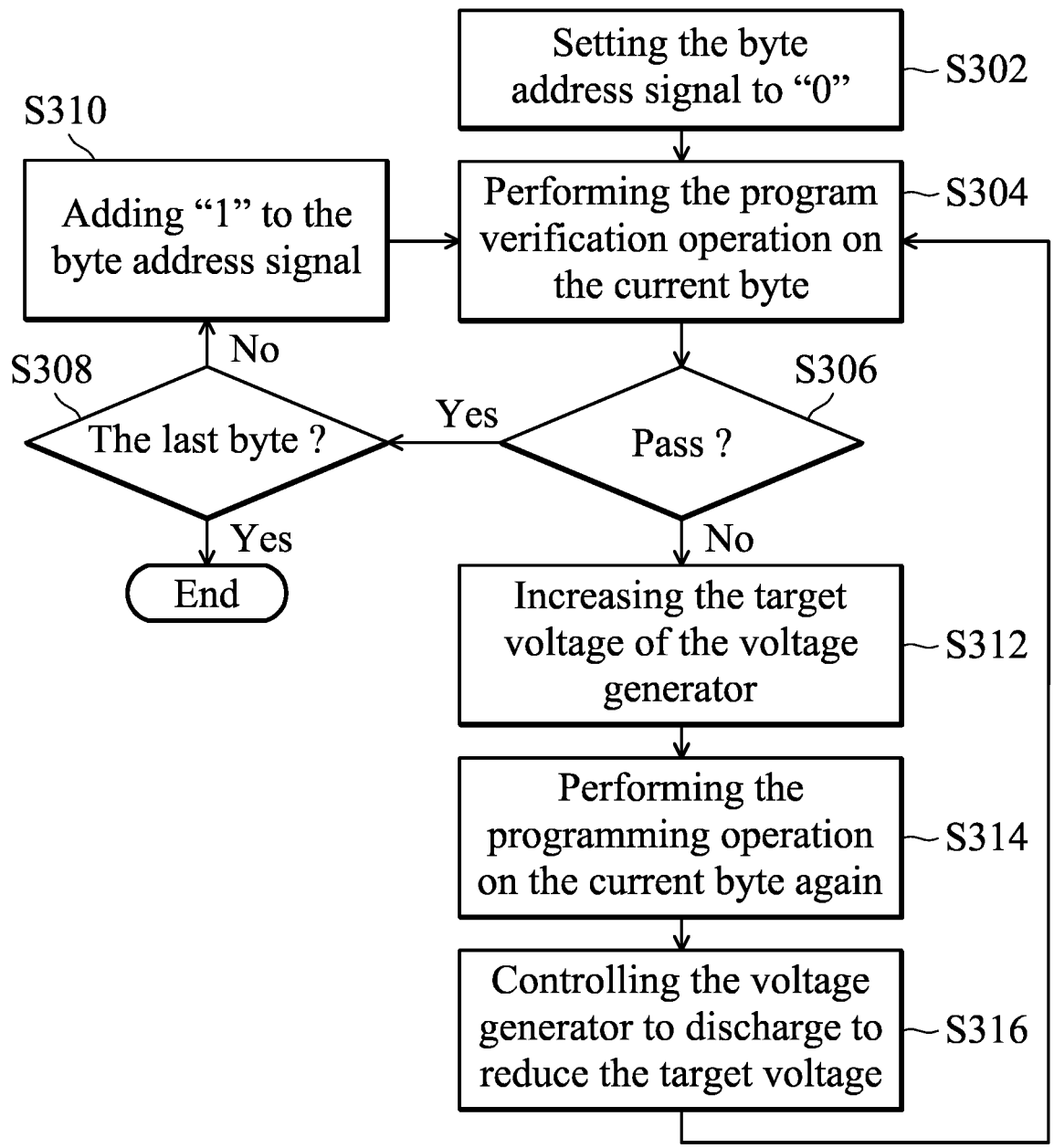
FIG. 3 shows a flow chart of the byte programming mode, according to an embodiment of the disclosure.

Please refer to the programming operation process of the page programming mode in FIG. 2. In step S202, the control circuit 111 sets the byte address signal BA to "0". In step S204, the control circuit 111 performs the programming verification operation on the current byte. The control circuit 111 may perform the programming operation on the current byte of the current page of the selected memory cell, for example, using a first target voltage to perform the programming operation on the current byte of the current page. The control circuit 111 then performs the programming verification operation on the current byte, for example, reading the data of the current byte of the current page and determining whether the threshold voltage of the memory cell corresponding to the current byte is greater than or equal to the verification voltage. For example, it takes the control circuit 111 time T1 to perform the programming verification operation on the current byte. If one page of the memory cell array contains 256 bytes, it takes the control circuit 111 time T1*256 to perform the programming verification operation on all bytes in the current page. For the sake of illustration, the current page containing 256 bytes is used as an example in all of the subsequent paragraphs.

When the control circuit 111 determines that the threshold voltage of the memory cell corresponding to the current byte is greater than or equal to the verification voltage, the control circuit 111 determines that the programming operation of the memory cell corresponding to the current byte is successful, i.e. the programming data has been normally stored in the memory cell corresponding to the current byte by the programming operation. When the control circuit 111 determines that the threshold voltage of the memory cell corresponding to the current byte is less than the verification voltage, the control circuit 111 determines that the programming operation of the memory cell is failed, and the control circuit 111 records the corresponding address of the memory cell whose programming operation is failed to the register 1111.

In step S206, the control circuit 111 determines whether the current byte is the last byte of the programming verification operation or not. If the current byte is the last byte of the programming verification operation, step S208 is performed. If the current byte is not the last byte of the programming verification operation, step S207 is performed to add "1" to the byte address signal BA.

In step S208, the control circuit 111 determines whether all of the bytes that have been performed the programming verification operation pass the verification or not. If all of the bytes that have been performed the programming verification operation pass the verification, this process ends. If not all of the bytes that have been performed the programming verification operation pass the verification, step S210 is performed. For example, the process of steps S202~S208 mainly performs the programming verification operation of each of the bytes of the current page, and the process of steps S210~S220 mainly performs the programming operation again (i.e. it performs a re-programming operation) to the bytes which failed in the program verification operation in step S204 by a higher voltage.

In step S210, the control circuit 111 sets the byte address signal BA to "0" and increases the target voltage of the voltage generator 112. For example, a second target voltage used to perform the programming operation again in step S216 is higher than the first target voltage used to perform the programming verification operation in step S204. Thus, it takes the voltage generator 112 time T2 to increase the output voltage of the charge bump from the first target voltage to the second target voltage.

In step S212, whether the current byte corresponding to the byte address signal BA is equal to a particular value (such as 0xFF) is determined. If the current byte is equal to the particular value, which means that the current byte has been performed the programming verification operation successfully and does not need to be programmed again, the process goes to step S214 to add "1" to the byte address signal BA. If the current byte is not equal to the particular value, which means that the current byte has failed the programming verification operation and needs to be programmed again (i.e., re-programming), the process goes to step S216. In addition, assume that it takes time T5 to perform step S212 each time, then it takes time T5*256 in total to perform step S212 to the 256 bytes in the current page.

In step S216, the control circuit 111 performs the programming operation on the current byte again. For example, because the current byte which has been performed the programming operation again in step S216 failed in the programming verification operation in step S204, the control circuit 111 controls the voltage generator 112 to perform the programming operation on the current byte with the higher second voltage again. Assume that there are N bytes fails the programming verification operation in the selected current page, and it takes time T3 to perform the programming operation on the current byte again, then it takes time T3*N to perform the programming operation on N current bytes again in the selected current page.

In step S218, the control circuit 111 determines whether the current byte programed again is the last byte or not. If the current byte programed again is the last byte, step S220 is performed. If the current byte programed again is not the last byte, step S214 is performed to add "1" to the byte address signal BA. For example, the control circuit 111 may determine whether the current byte in the current page is the last byte or not.

In step S220, the control circuit 111 controls the voltage generator 112 to discharge to reduce the target voltage. For example, when the current byte is determined to be the last byte in step S218, which means the process of re-programming is complete, so the voltage generator 112 has to reduce its output voltage from the second target voltage to the first target voltage (or other target voltage). Namely, it takes the charge pump time T4 to discharge to reduce its output voltage from the second target voltage to the first target voltage.

Thus, in the process of FIG. 2, it takes total time T=(T1+T5)*256+T2+T3*N+T4 to perform page programming on the 256 bytes in one page.

Please refer to the programming operation process of the byte programming mode in FIG. 3. In the byte programming mode, the control circuit 111 performs the programming verification operation on the memory cell corresponding to the current byte in the current page one by one, and performs the programming operation on the memory cell corresponding to the current byte again (i.e., re-programming) when the programming verification operation of the current byte fails. In step S302, the control circuit 111 sets the byte address signal BA to "0". In step S304, the control circuit 111 performs the programming verification operation on the current byte.

In step S306, the control circuit 111 determines whether the current byte passes the programming verification operation or not. If the current byte passes the programming verification operation, step S308 is performed. If the current byte does not pass the programming verification operation, step S308 is performed. For example, it takes the control circuit 111 time T1 to perform the programming verification operation on the current byte.

In step S308, the control circuit 111 determines whether the current byte is the last byte of the programming verification operation or not. If the current byte is the last byte of the programming verification operation, the process ends. If the current byte is not the last byte of the programming verification operation, step S310 is performed to add "1" to the byte address signal BA.

In step S312, the control circuit 111 increases the target voltage of the voltage generator 112. For example, the second target voltage used to perform the programming operation again in step S314 is higher than the first target voltage used to perform the programming verification operation in step S304. Thus, it takes the voltage generator 112 time T2 to increase the output voltage of the charge bump from the first target voltage to the second target voltage.

In step S314, the control circuit 111 performs the programming operation on the current byte again (i.e., re-programming). For example, because the current byte which has been performed the programming operation again in step S314 failed in the programming verification operation in step S304, the control circuit 111 controls the voltage generator 112 to perform the programming operation on the current byte with the higher second voltage again, and it takes time T3 to perform the programming operation on the current byte again.

In step S316, the control circuit 111 controls the voltage generator 112 to discharge to reduce the target voltage. For example, in the byte programming mode, the control circuit 111 performs the programming operation again on the memory cell corresponding to the current byte when the current byte fails in the programming verification operation. Thus, when the re-programming operation is completed, the voltage generator 112 has to reduce its output voltage from the second target voltage to the first target voltage (or other target voltage), i.e. it takes the charge pump time T4 to discharge to reduce its output voltage from the second target voltage to the first target voltage.

Thus, in the process of FIG. 3, it takes total time T=(T1+T2+T3+T4)*N to perform byte programming to the 256 bytes in one page.

Please refer to FIG. 2 and FIG. 3 again, assume that time T1, T2, T3, T4, and T5 is 350 ns, 4 µs, 1 µs, 1 µs, and 100 ns respectively, then the time tPG and time tBT for each cycle of the page programming mode and the byte programming mode are as shown in equation (1) and equation (2), respectively:

$$tPG = 256 \times (350\text{ns} + 100\text{ns}) + 1\mu s \times N + 4\mu s + 1\mu s \quad (1)$$
$$= 120.2\mu s + 1\mu s \times N$$
$$tBT = (350\text{ns} + 4\text{ns} + 1\mu s + 1\mu s) \times N \quad (2)$$
$$= 6.35\mu s \times N$$
$$tBT = (350\text{ns} + 4\text{ns} + 1\mu s + 1\mu s) \times N \quad (2)$$
$$= 6.35\mu s \times N$$

Figure 4:
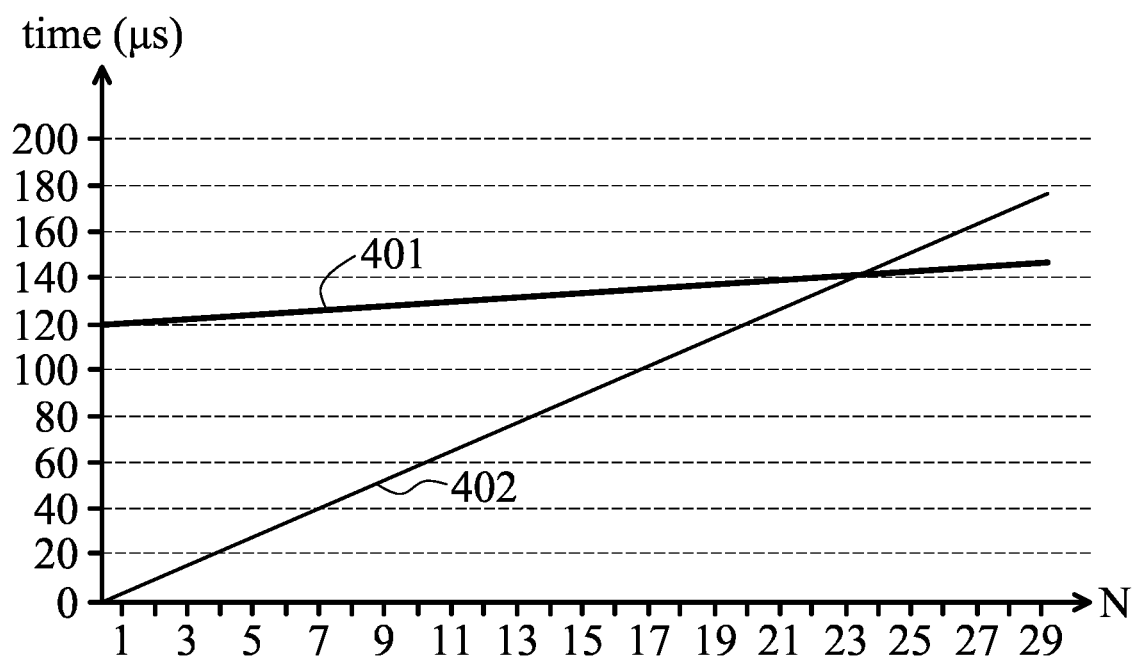
FIG. 4 shows a schematic view of the overall programming time of the page programming mode and the byte programming mode, according to an embodiment of the disclosure.

Wherein, N indicates the number of bytes that need to be programed again in one page of the memory cell array. Please refer to FIG. 4, from equation (1) and equation (2), it can be derived that if the time tBT (line 402) required for each cycle of byte programming mode is larger than the time tPG (line 401) required for each cycle of page programming mode, then N≥23. However, corresponding value of N can be calculated according to the actual situation. In other words, when the value of N is small (e.g. less than 23), the overall programming time can be saved by using byte programming mode. When the value of N is large (e.g. greater than or equal to 23), the overall programming time can be saved by using page programming mode.

Figure 5A:
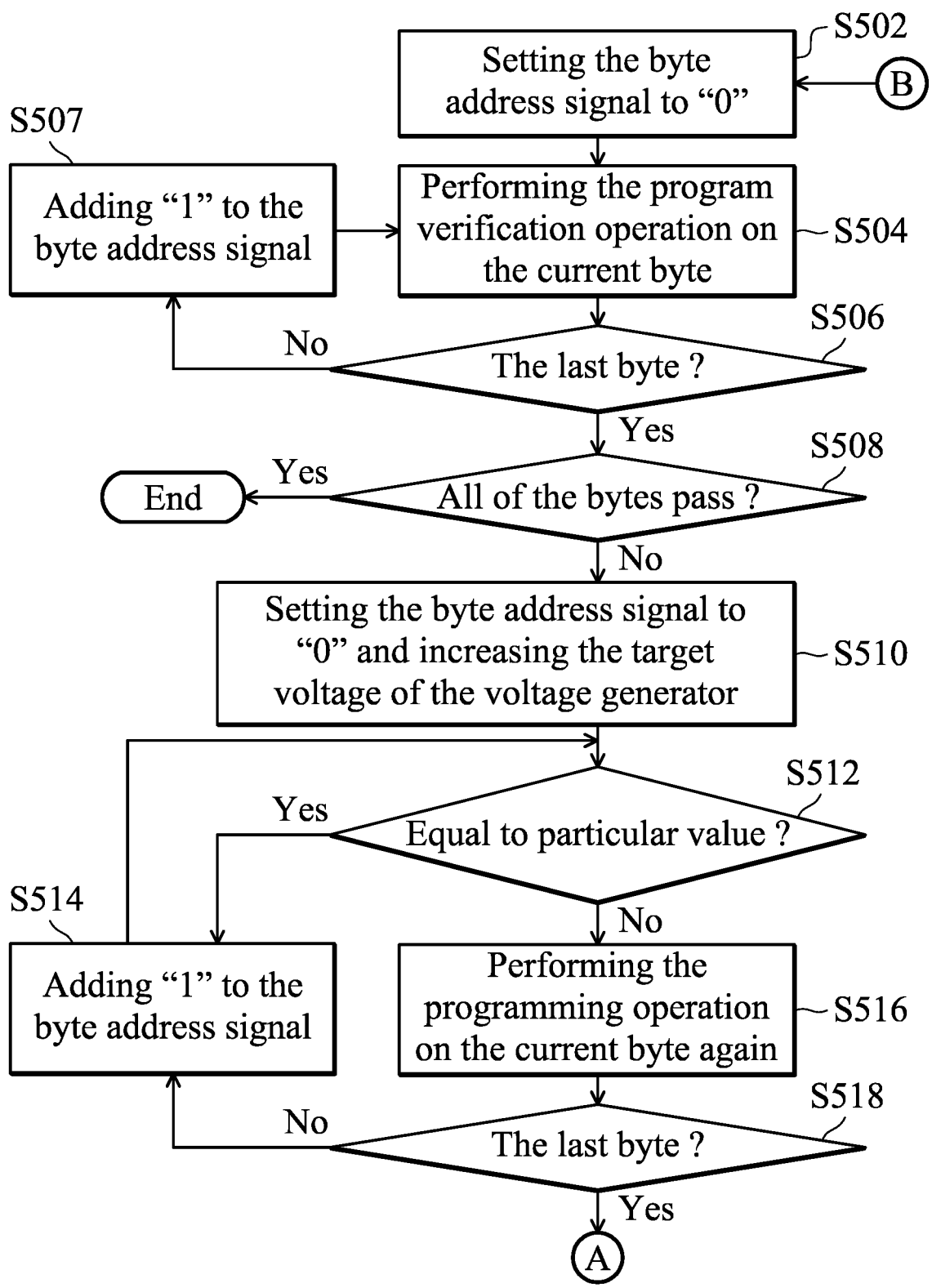
FIGS. 5A-5B show flow charts of a method for adaptively programming flash memory, according to an embodiment of the disclosure.
Figure 5B:
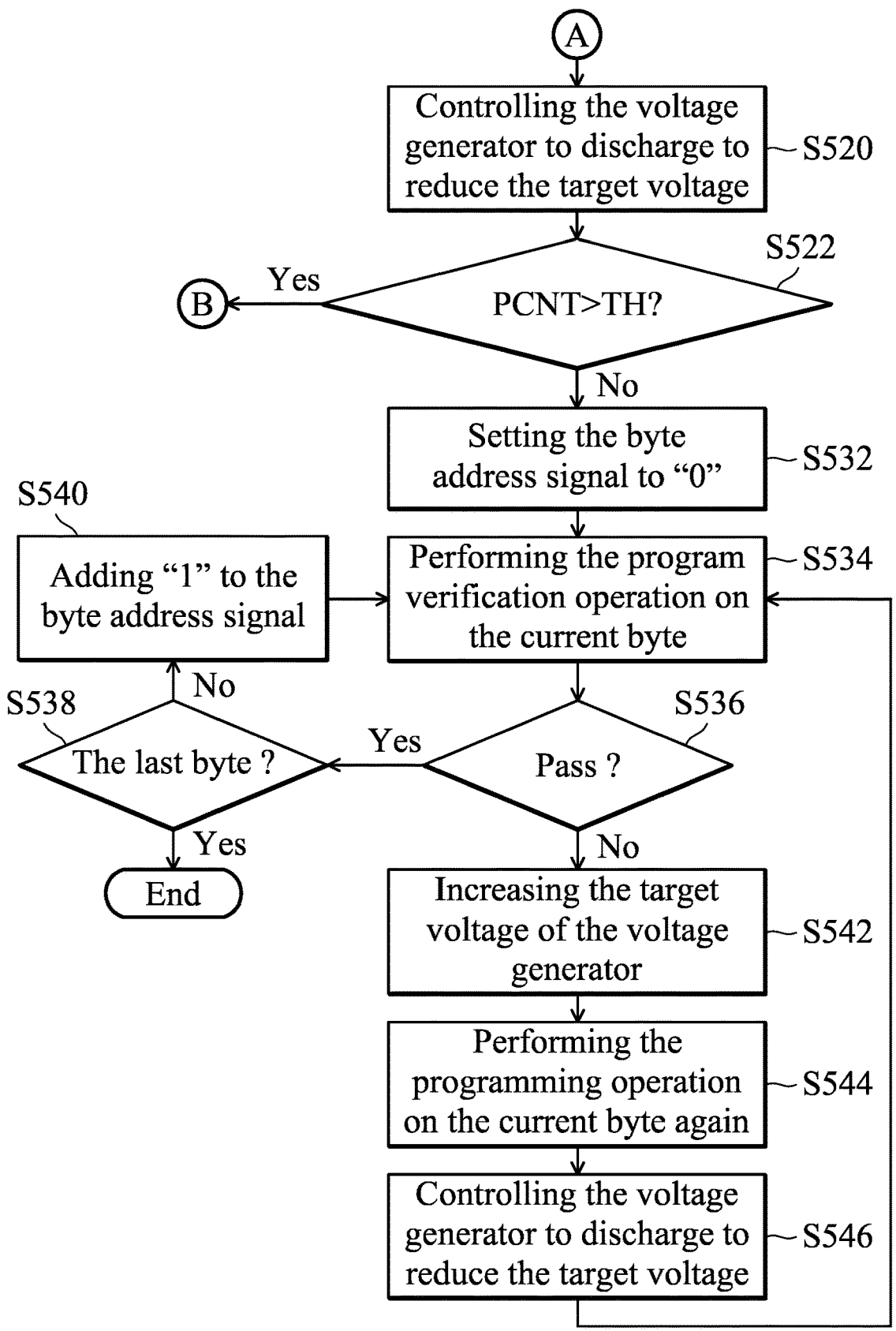

FIGS. 5A-5B are flow charts of a method for adaptively programming flash memory, according to an embodiment of the disclosure. Please refer to FIG. 1 and FIGS. 5A-5B.

Steps S502~S520 in FIGS. 5A-5B are similar to steps S202~S220 in FIG. 2, except that step S510 and step S516 in FIGS. 5A-5B are slightly different from the step S210 and step S216 in FIG. 2. Moreover, steps S532~S546 in FIGS. 5A-5B are similar to steps S302~S316 in FIG. 3. Thus, steps other than steps S510, S516, and S522 in FIG. 5A-5B can refer to the embodiments of FIG. 2 and FIG. 3 and the details are not described here.

Control circuit 111 sets programming operation counter PCNT in the register 1111, which is configured to record the number of bytes need to be performed the programming operation again in the same page in the page programming mode.

In step S510, control circuit 111 sets the byte address signal BA to "0", adjusts the target voltage of the voltage generator 112, and resets the programming operation counter PCNT (e.g. to a first amount). For example, because the programming operation counter PCNT is configured to record the number of bytes need to be performed the programming operation again in the same page in the page programming mode, so whenever the control circuit 111 performs programming on the different page of the flash memory 150, the control circuit 111 always resets the programming operation counter PCNT.

In step S516, the control circuit 111 performs the programming operation again on the current byte and pluses "1" to the programming operation counter PCNT. For example, in the page programming mode of the current page, whenever the control circuit 111 wants to perform the programming operation again on the current byte corresponding to the byte address signal BA, the control circuit 111 always accumulates the programming operation counter PCNT to calculate the number of bytes need to be performed the programming operation again in the current page. When the last byte in the current page is determined in the step S518, it means that all the bytes in the current page have completed the programming operation or the programming operation again. Thus, the programming operation counter PCNT obtained at this time indicates the total number of bytes have been performed the programming operation again in the current page.

In step S522, the control circuit 111 determines whether the programming operation counter PCNT is greater than the predetermined threshold value TH. When the control circuit 111 determines that the programming operation counter PCNT is greater than the predetermined threshold value TH, then the control circuit 111 uses the page programming mode as the programming mode in the next page. When the control circuit 111 determines that the programming operation counter PCNT isn't greater than (i.e. less than or equal to) the predetermined threshold value TH, then the control circuit 111 uses the byte programming mode as the programming mode in the next page.

In detail, the adjacent pages of the same physical block in the flash memory 150 have similar physical properties, and the threshold voltage of some adjacent memory cells may change after the flash memory 150 being cyclic used multiple times. So when performing the programming verification operation on these memory cells with the predetermined first target voltage, the programming verification operation may fail. Thus, it is required to perform the programming operation on these memory cells again with the higher second target voltage. Moreover, assume that a part of the memory cells in the flash memory 150 require longer programming time, only using byte programming mode may cause the overall programming time significantly increase.

Thus, when the control circuit 111 determines that the programming operation counter PCNT is greater than the predetermined value through the process in FIGS. 5A-5B, the control circuit 111 uses the page programming mode in the next page (i.e. the page after the current page) to achieve less overall programming time, because the page after the current page may have the similar programming operation counter PCNT. Similarly, when the control circuit 111 determines that the programming operation counter PCNT is not greater than the predetermined value through the process in FIGS. 5A-5B, the control circuit 111 use the byte programming mode in the next page to achieve less overall programming time.

As described above, the present disclosure provides a memory controller and a method for adaptively programming flash memory, which can adaptively determine programming mode used in the next page based on the number of byte need to be performed the programming operation again in the current page in the page programming mode. For example, the memory controller and the method for adaptively programming flash memory may switch between the page programming mode and the byte programming mode to achieve less overall programming time.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory controller for controlling a flash memory, the memory controller comprises:

a control circuit, configured to program one or more pages in the flash memory in sequence, wherein each page includes a plurality of bytes; and a voltage generator, configured to adjust an output voltage according to a control signal from the control circuit;

wherein the control circuit performs a programming verification operation on each byte of a current page of the one or more pages in a page programming mode, calculates a first number of bytes which fail the programming verification operation and have been performed a programming operation again;

wherein the control circuit determines a programming mode of the page after the current page as the page programming mode or a byte programming mode according to the first number;

wherein the control circuit determines the programming mode of the page after the current page as the page programming mode when the first number is greater than a predetermined threshold value;

wherein the control circuit determines the programming mode of the page after the current page as the byte programming mode when the first number is less than or equal to the predetermined threshold value.

2. The memory controller as claimed in claim 1, wherein the voltage generator is a charge pump, and the voltage generator provides a first target voltage to perform the programming verification operation of the bytes and provides a second target voltage to perform the programming operation of the bytes that fail the programming verification operation again;

wherein the second target voltage is higher than the first target voltage.

3. The memory controller as claimed in claim 2, wherein in the page programming mode, after the programming operation of the bytes that fail the programming verification operation is completed, the control circuit controls the voltage generator to discharge to decrease the output voltage of the voltage generator from the second target voltage to the first target voltage.

4. The memory controller as claimed in claim 2, wherein in the byte programming mode, the control circuit sets a byte address signal to "0" and performs the programming verification operation on each byte in the page after the current page one by one;

wherein, when the programming verification operation of a particular byte of the page after the current page succeeds, the control circuit adds "1" to the byte address signal and continues the programming verification operation of the byte corresponding to the added byte address signal;

wherein, when the programming verification operation of the particular byte of the page after the current page fails, the control circuit controls the voltage generator to charge the output voltage of the voltage generator to the second target voltage to perform the programming verification operation of the particular byte;

wherein, after the programming verification operation of the particular byte is completed, the control circuit controls the voltage generator to discharge the output voltage of the voltage generator to the first target voltage to perform the programming verification operation on the byte after the particular byte.

5. The memory controller as claimed in claim 4, wherein the control circuit sets the byte address signal to "0", increases the target voltage of the voltage generator, and resets the first number when the programming verification operation has already been performed on each of the bytes in the page after the current page and the programming verification operation of any of the bytes in the page after the current page fails.

6. The memory controller as claimed in claim 5, wherein, in response to the current byte of the byte address signal not being equal to a particular value, the control circuit performs the programming operation on the current byte again and adds "1" to the first number.

7. A method for adaptively programming a flash memory, performed by a memory controller, wherein the memory controller comprises a control circuit and a voltage generator, and the method comprises:
  programming one or more pages in the flash memory in sequence via the control circuit, wherein each page includes a plurality of bytes;
  performing a programming verification operation on each byte of a current page of the one or more pages in a page programming mode, and calculating a first number of bytes which fail the programming verification operation and have been performed a programming operation again, using the control circuit;
  determining a programming mode of the page after the current page as the page programming mode or a byte programming mode according to the first number using the control circuit;
  determining the programming mode of the page after the current page as the page programming mode using the control circuit when the first number is greater than a predetermined threshold value; and
  determining the programming mode of the page after the current page as the byte programming mode using the control circuit when the first number is less than or equal to the predetermined threshold value.

8. The method as claimed in claim 7, wherein the voltage generator is a charge pump, and the method further comprises:
  using the voltage generator to provide a first target voltage to perform the programming verification operation of the bytes and to provide a second target voltage to perform the programming operation of the bytes that failed in the programming verification operation again, wherein the second target voltage is higher than the first target voltage.

9. The method as claimed in claim 8, further comprising:
  in the page programming mode, after the programming operation of the bytes that failed in the programming verification operation has been completed, controlling the voltage generator to decrease an output voltage of the voltage generator from the second target voltage to the first target voltage using the control circuit.

10. The method as claimed in claim 8, further comprising:
  in the byte programming mode, setting a byte address signal to "0" and performing the programming verification operation on each byte in the page after the current page one by one via the control circuit;
  adding "1" to the byte address signal and continuing the programming verification operation of the byte corresponding to the added byte address signal using the control circuit, when the programming verification operation of a particular byte of the page after the current page succeeds;
  controlling the voltage generator to charge the output voltage of the voltage generator to the second target voltage to perform the programming verification operation of the particular byte using the control circuit, when the programming verification operation of the particular byte of the page after the current page fails; and
  controlling the voltage generator to discharge the output voltage of the voltage generator to the first target voltage to perform the programming verification operation on the byte after the particular byte using the control circuit after the programming verification operation on the particular byte is completed.

11. The method as claimed in claim 10, further comprising:
  setting the byte address signal to "0", increasing the target voltage of the voltage generator, and resetting the first number by the control circuit when the programming verification operation has already been performed on each of the bytes in the page after the current page and the programming verification operation of any of the bytes in the page after the current page fails.

12. The method as claimed in claim 11, further comprising:
  performing the programming operation on the current byte again and adds "1" to the first number by the control circuit in response to the current byte of the byte address signal not being equal to a particular value.

* * * * *